United States Patent
Roemer et al.

[11] Patent Number: 5,365,927
[45] Date of Patent: Nov. 22, 1994

[54] MAGNETIC RESONANCE IMAGING SYSTEM WITH POINTING DEVICE

[75] Inventors: Peter B. Roemer, Schenectady, N.Y.; Samuel M. Blumenfeld, Milwaukee, Wis.; Kirby G. Vosburgh; Harvey E. Cline, both of Schenectady, N.Y.; William D. Barber; William E. Lorensen, both of Ballston Lake, N.Y.; Richard L. St. Peters; John F. Schenck, both of Schenectady, N.Y.; Charles L. Dumoulin, Ballston Lake, N.Y.; Robert D. Darrow, Scotia, N.Y.; Christopher J. Hardy, Schenectady

[73] Assignee: General Electric Company, Schenectady, N.Y.

[21] Appl. No.: 146,345

[22] Filed: Nov. 2, 1993

[51] Int. Cl.⁵ ............................................. A61B 5/055
[52] U.S. Cl. ................................... 128/653.2; 324/309
[58] Field of Search ............... 128/653.1, 653.2, 653.5; 606/130; 324/309, 318, 322

[56] References Cited

U.S. PATENT DOCUMENTS

| | | | |
|---|---|---|---|
| 4,875,485 | 10/1989 | Matsutani | 128/653.5 |
| 5,050,608 | 9/1991 | Watanabe et al. | 606/130 |
| 5,153,546 | 10/1992 | Laskaris | 324/318 |
| 5,211,165 | 5/1993 | Dumoulin et al. | |
| 5,239,265 | 8/1993 | Sugahara | 324/309 |
| 5,271,400 | 12/1993 | Dumoulin et al. | 128/653.5 |

Primary Examiner—Ruth S. Smith
Attorney, Agent, or Firm—Lawrence P. Zale; Marvin Snyder

[57] ABSTRACT

A magnetic resonance (MR) imaging system for use in a medical procedure employs an open main magnet allowing access to a portion of a patient within an imaging volume, for producing a main magnetic field over the imaging volume; a set of open gradient coils which provide magnetic fields gradients over the imaging volume without restricting access to the imaging volume; a radiofrequency coil set for transmitting RF energy into the imaging volume to nutate nuclear spins within the imaging volume and receive an MR response signal from the nuclear spins; and a pointing device for indicating the position and orientation of a plane in which an image is to be acquired; an image control means for operating power supplies for the gradient coils and the RF coils to acquire an MR signal from the desired imaging plane; and a computation unit for constructing an image of the desired imaging plane. The MR imaging system is intended to operate to provide images to a physician during medical procedures to guide the physician in his procedures.

6 Claims, 5 Drawing Sheets

MAGNETIC RESONANCE IMAGING SYSTEM WITH POINTING DEVICE

CROSS REFERENCE TO RELATED APPLICATIONS

This application is related to U.S. patent applications "Magnetic Resonance Guided Focussed Ultrasound Surgery" by Harvey Cline et al. Ser. No. 07/854,040 filed Mar. 19, 1992 now U.S. Pat. No. 5,427,935, "Magnetic Resonance Surgery Using Heat Waves Produced with Focussed Ultrasound" by Harvey Cline et al. Ser. No. 07/751,259 filed Aug. 29, 1991 now U.S. Pat. No. 5,291,890; "Magnetic Resonance Surgery Using Heat Waves Produced with a Laser Fiber" by Harvey E. Cline et al. Ser. No. 125,520 field Sep. 24, 1991; U.S. Pat. No. 5,153,546 open MRI. Magnets by Evangelos T. Laskaris issued Jun. 8, 1990; and "Open Gradient Coils for Magnetic Resonance Imaging" by William Barber et al. Ser. No. 08/146,346 fiel Nov. 2, 1993; all assigned to the present assignee and hereby incorporated by reference.

BACKGROUND OF THE INVENTION

1. Field of the Invention

The present application relates to magnetic resonance (MR) imaging system, and more specifically to MR Imaging system which allows access to the patient during imaging.

2. Description of Related Art

In Magnetic Resonance (MR) Imaging magnetic field gradients are produced over a patient desired to be imaged by energizing gradient coils which produce magnetic fields which interact with a static magnetic field produced by a main magnet. Radiofrequency (RF) excitation pulses produce RF energy which is radiated through the patient, nutating resonating nuclei "nuclear spins". These nutated nuclear spins produce a spatially dependent MR response signal when proper readout magnetic field gradients are applied to them. In order to produce accurate images, the main magnetic field must be spatially homogeneous over the imaging region. Also, the magnetic field gradients must also be spatially homogeneous.

Typically, to produce a homogeneous magnetic field over the patient, the main magnet has a cylindrical shape which surrounds the patient. The gradient coils are also cylindrically shaped and fit inside the main magnetic and also surround the patient. Access to the patient is, therefore, severely limited due to the geometry of the magnet and gradient coils. In addition to limited access, patients typically develop a claustrophobic reaction during imaging.

In order to provide MR images of a patient in conventional systems, the three dimensional position and orientation of a desired region of the patient to be imaged must be provided to the MR imaging system. The three dimensional orientation must also be provided, in addition to the location. These orientations must be calculated manually. Even though the computations may not be difficult, it makes it cumbersome to produce several images at different orientations.

Currently there is a need for an MR imaging system which provides MR images of selected internal structures of a patient undergoing a medical procedure in which a physician may easily indicate a desired region and a desired viewing angle.

SUMMARY OF THE INVENTION

An open magnetic resonance (MR) imaging system provides images of a patient undergoing a medical procedure. The MR imaging system having an open main magnet having a pair of tings with an imaging volume accessible by a physician positioned outside of the main magnet. A patient is positioned such that a region of the patient desired to be imaged is located within the imaging volume. The open main magnet produces a static magnetic field that is homogeneous over the imaging volume.

A gradient amplifier energizes the gradient coils, positioned within the open magnet rings, and produces a magnetic field gradient over the desired region of the patient in the imaging volume while providing access to the patient.

Open radiofrequency (RF) coils driven by an RF transmitter, transmit RF radiation into the patient causing nutation of nuclear spins within the desired region of the patient and do not restrict access to the patient.

A physician employs a pointing device to define a three-dimensional position and orientation of a plane desired to be imaged within the imaging volume. This information is provided in proper form to a general purpose computer which provides parameters to a pulse sequencer allowing an image defined by the pointing device to be created. The pulse sequencer controls a gradient amplifier and RF transmitter according to a prescribed pulse sequence. An MR response signal is generated by nuclear spins in the imaging plane of the patient.

A receiver receives the MR response signals and passes this signal to a reconstruction unit which computes an image signal from the MR response signal which is displayed on a display means to the physician performing the medical procedure, thereby aiding the physician.

OBJECTS OF THE INVENTION

It is an object of the invention to provide a magnetic resonance (MR) imaging system which allows a physician to perform medical procedures on a patient, while the patient is being imaged.

Another object of the present invention is to provide MR images to a physician to aid the physician in performing medical procedures.

Another object of the present invention is to allow a physician to interactively select a position and orientation of imaging planes for MR images.

Another object of the present invention is to provide a MR imaging system which provides MR images of a patient while minimizing the claustrophobic reactions of the patient.

BRIEF DESCRIPTION OF THE DRAWINGS

The features of the invention believed to be novel are set forth with particularity in the appended claims. The invention itself, however, both as to organization and method of operation together with further objects and advantages thereof, may best be understood by reference to the following description taken in conjunction with the accompanying drawing in which:

DETAILED DESCRIPTION OF THE INVENTION

Figure 1:
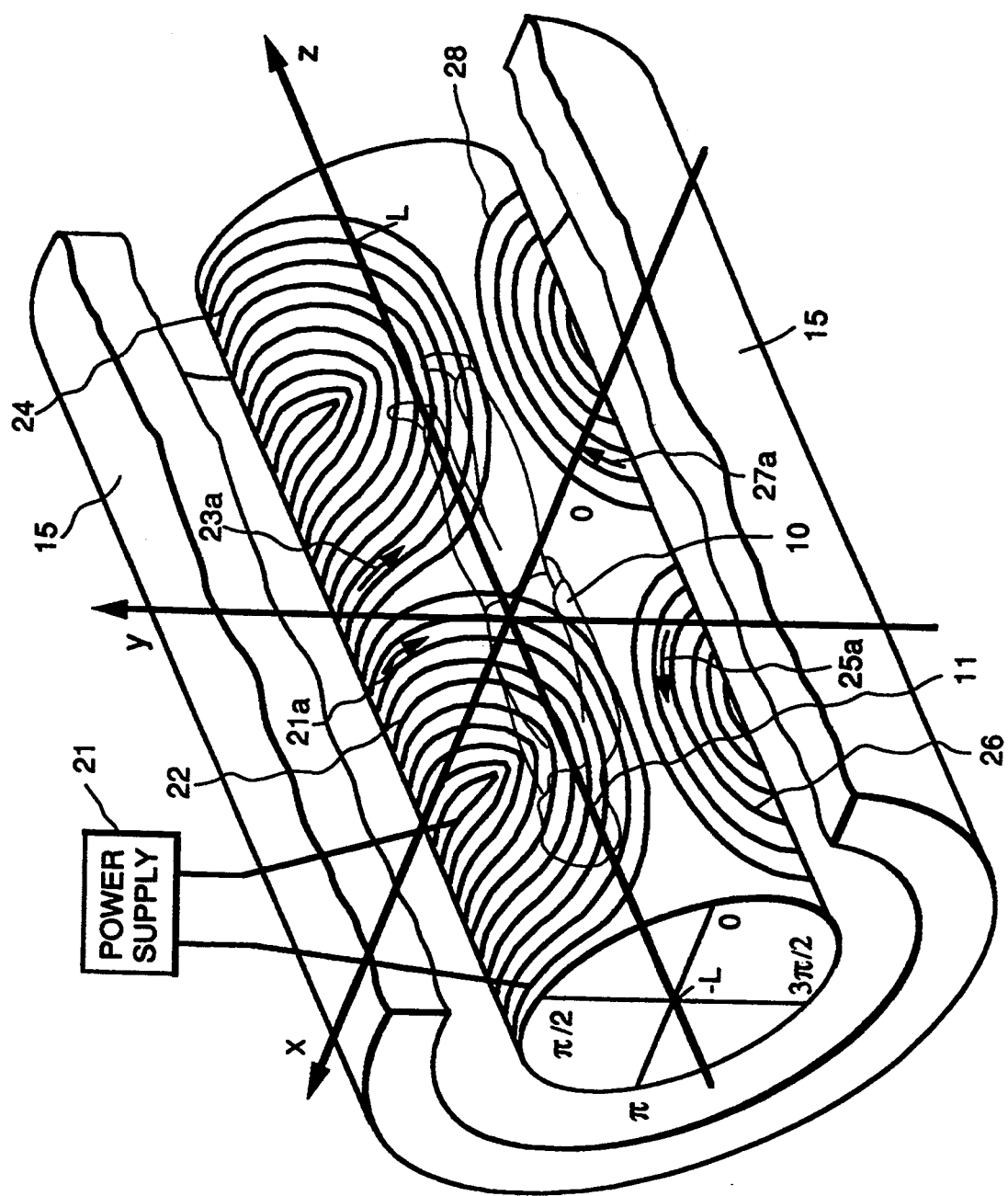
FIG. 1 is a partial diagram of a prior art whole-body gradient coils, and conventional main magnet for a magnetic resonance (MR) imaging system.

FIG. 1 is a schematic diagram of a portion of the apparatus used in conventional MR imaging. A magnet 15, usually a super-conducting magnet, surrounds the entire apparatus. A body gradient coil assembly 20 is shown as it would be implemented inside the magnet 15. The body gradient coil assembly 20 is comprised of four gradient coils each for the "X" and "Y" axes, which resemble a fingerprint, called fingerprint coils 22, 24, 26 and 28. Current is passed through the fingerprint coils by a power supply 21. Power supply 21 provides a current which passes through fingerprint coil 22 in a direction marked by arrow 21a. Similarly, power supply 21 supplies current which passes through fingerprint coils 24, 26 and 28 in the direction marked by arrows 23a, 25a and 27a, respectively.

Due to its geometry, access to the patient is limited only to openings at either end of the whole body gradient coil set.

Figure 2A:
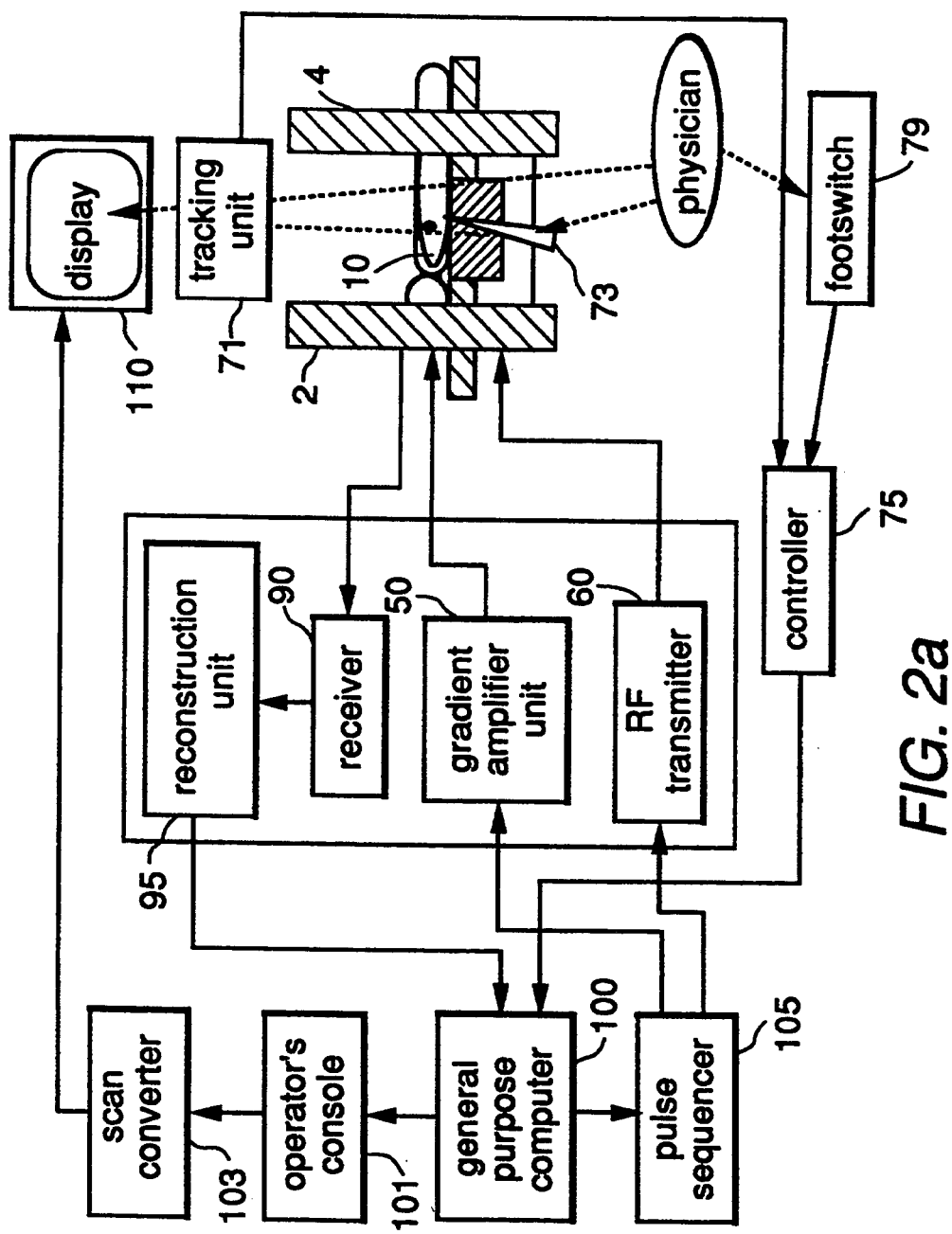
FIG. 2a is a block diagram of a first embodiment of a magnetic resonance (MR) imaging system according to the present invention.

A block diagram of the magnetic resonance (MR) imaging system of the present invention is shown in FIG. 2a. A patient 10 is positioned within an open main magnet, having two superconducting tings 2, 4, is arranged as a modified "Helmholtz pair" which provides a static, spatially homogeneous magnetic field over an imaging volume between the tings. The spacing between the tings is slightly different from that of a "Helmholtz pair" in order to elongate the imaging volume, and is therefore termed a "modified Helmholtz pair". A gradient amplifier 50 provides power to a plurality of gradient coil sets located within tings 2, 4, each producing a magnetic field gradient in a specified direction. An RF transmitter 60, supplies the necessary power to RF coils to nutate nuclear spins within a patient in the imaging volume. The gradient coil sets within rings 2, 4 produce magnetic field gradients over the imaging volume without restricting access to the imaging volume, or the patient within the imaging volume.

A physician may use a pointing device to indicate a region of patient 10 to be imaged. Not only can the pointing device indicate where the image is to be acquired, but can indicate the orientation in which it is to be viewed. The plane of the patient in which the image is acquired is known as the "imaging plane". Many different devices can be used to identify the imaging plane.

In FIG. 2a, a set of infrared cameras act as tracking unit 71 (in the preferred embodiment were manufactured by the PIXSYS corporation) track the positions of two light emitting diodes (LEDs) on a hand-held pointer 73. A physician points pointer 73 at a region of patient 10 desired to be imaged. Since tracker 71 knows the position of the LEDs of pointer 73, it may easily calculate a direction in which pointer 73 is pointing and its location. The physician then indicates a distance along this direction to uniquely define an imaging plane perpendicular to this direction. The distance along the direction of pointer 73 may be provided to general purpose computer by a footswitch 79 via controller 75. The distance may be a preset distance, or be manually provided to an operator's console 101 of general purpose computer 100.

Figure 2B:
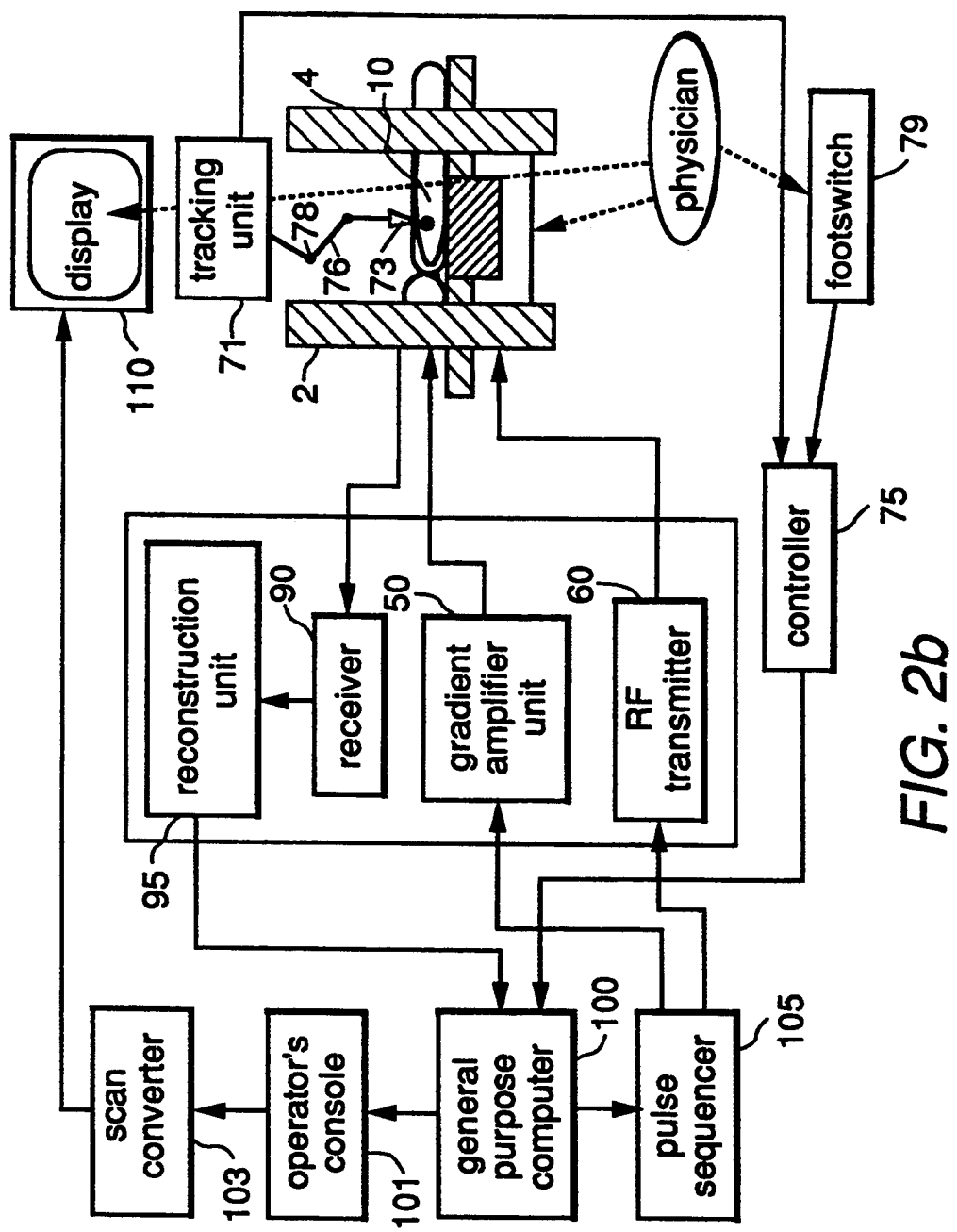
FIG. 2b is a block diagram of a second embodiment of a magnetic resonance (MR) imaging system according to the present invention.

In the embodiment of FIG. 2b, a mechanical arm 76 (in the preferred embodiment manufactured by the FARO corporation) is attached to the inner face of the magnet tings 2, 4 which provide a position reference. Sensors on joints 78 of mechanical arm 76 indicate the position and orientation of pointer 73.

Other embodiments of the pointing device may employ a second RF transmitter having several transmitter coils attached to pointer 73. The second RF transmitter may be self-contained within pointer 73 or be connected to the transmitter coils on pointer 73. Tracking unit 71 has several receive coils which receive the signal transmitted by the transmitter coils on pointer 73 and determines the location of the transmitter coils. Since their relative position on pointer 73 is fixed, the direction in which the pointer is pointing, and the location of pointer 73 may be determined. Since reciprocity exists between transmitter and receiver coils, the transmitter coils may be positioned external to the pointer with receiver coils attached to pointer 73. The signals received by pointer 73 are then passed to tracking unit This type of tracking device was disclosed in U.S. Pat. No. 5,211,165 "Tracking System to Follow the Position and Orientation of a Device with Radiofrequency Field Gradients" by Dumoulin, Darrow, Schenck, Souza issued May 18, 1993.

Controller 75 receives the image plane information and provides this information to general purpose computer 100 which activates a pulse sequencer 105. Pulse sequencer 105 controls the timing and activation of gradient amplifier 50 and RF transmitter 60 to produce magnetic field gradients and RF radiation which cause an MR response signal to be emitted by tissue of patient 10 in the imaging plane.

MR tracking devices such as those disclosed in U.S. patent application "Tracking System to Monitor the Position and Orientation of a Device Using Magnetic Resonance Detection of a Sample contained Within the Device" by Charles L. Dumoulin, Steven P. Souza, Robert D. Darrow Ser. No. 07/861,662 filed Apr. 1, 1992 may also be employed to track the position and orientation of pointer 73 to determine the imaging plane, however, they do not require tracking unit 71. Pointer 73 has a receiver attached to it which detects magnetic reference signals responsive to a tracking pulse sequence.

A receiver 90 receives the emitted MR response signal from the imaging plane of patient 10, and provides this signal to a reconstruction unit 95. Reconstruction unit 95 produces data for an MR image of patient 10 at the imaging plane. The image data is provided to general purpose computer 100 which displays an MR image on operator's console 101. An output of the operator's console 101 provides the data to a scan converter 103 which changes the format of the signal and provides it to a display 110. The image of the imaging plane is displayed to the physician on display 110 to aid the physician during medical procedures such as surgery.

Display device 110 may be located near the physician. Due to the large magnetic fields the display device would be have to be a liquid crystal display. Also since there is substantial RF radiation, it should be enclosed in a suitable RF shielding to minimize RF interference.

Another method of displaying images to the physician is by employing a projection television located outside the magnet room with images projected onto a screen located within the viewing area of the physician.

Footswitch 79 or other input device such as a foot pedal near the magnet controls may also be used to control the scanner timing and provide rudimentary controls such as changing scan modes or scan type. This may be used to toggle between spin echo imaging, gradient echo imaging or any other menu of preset parameters.

The present invention may be implemented to obtain an image of the tissue at some depth below the surface to locate a tumor, a blood vessel or nerve. It may be employed in guiding placement of a biopsy needle or a laser fiber. Images could be also be acquired parallel to the direction of pointing device 73 with another input specifying the last degree of freedom Images taken parallel to the vector might be particularly useful in showing the trajectory of biopsy needle, laser fiber or other surgical device.

The present invention may execute many types of pulse sequences including real-time temperature-sensitive MR pulse sequences as described in U.S. patent application "Heat Surgery System Monitored by Real-Time Magnetic Resonance Profiling" by Christopher J. Hardy and Harvey E. Cline Ser. No. 08/038,204, filed Mar. 26, 1993. This will allow the physician to image heated regions in addition to interval structures to selectively heat desired tissues.

Open magnets have been recently introduced as described in the aforementioned U.S. patent application by Laskaris. These are acceptable for use with the present invention.

Since most gradient conventional gradient coil designs require a major portion of their current carrying conductors to be near the central region, the use of conventional gradient coils would obstruct the open area provided by the open magnet, thereby defeat the purpose of the open magnet.

In order to provide maximum access to the patient, carriers on which the gradient coils would be disposed, were restricted to fit within regions within the bores of the tings of the open magnet. Classical potential theory requires the current surface be as close to the desired useful volume as possible and subtend as large a solid angle as possible for greatest efficiency.

In order to actively cancel eddy currents in a most efficient way, the shield coils must be positioned as near as possible to the surface where cancellation is desired. The shield coil should also have a current density distribution as similar to that induced on a nearby conductor to provide eddy current cancellation.

Figure 3:
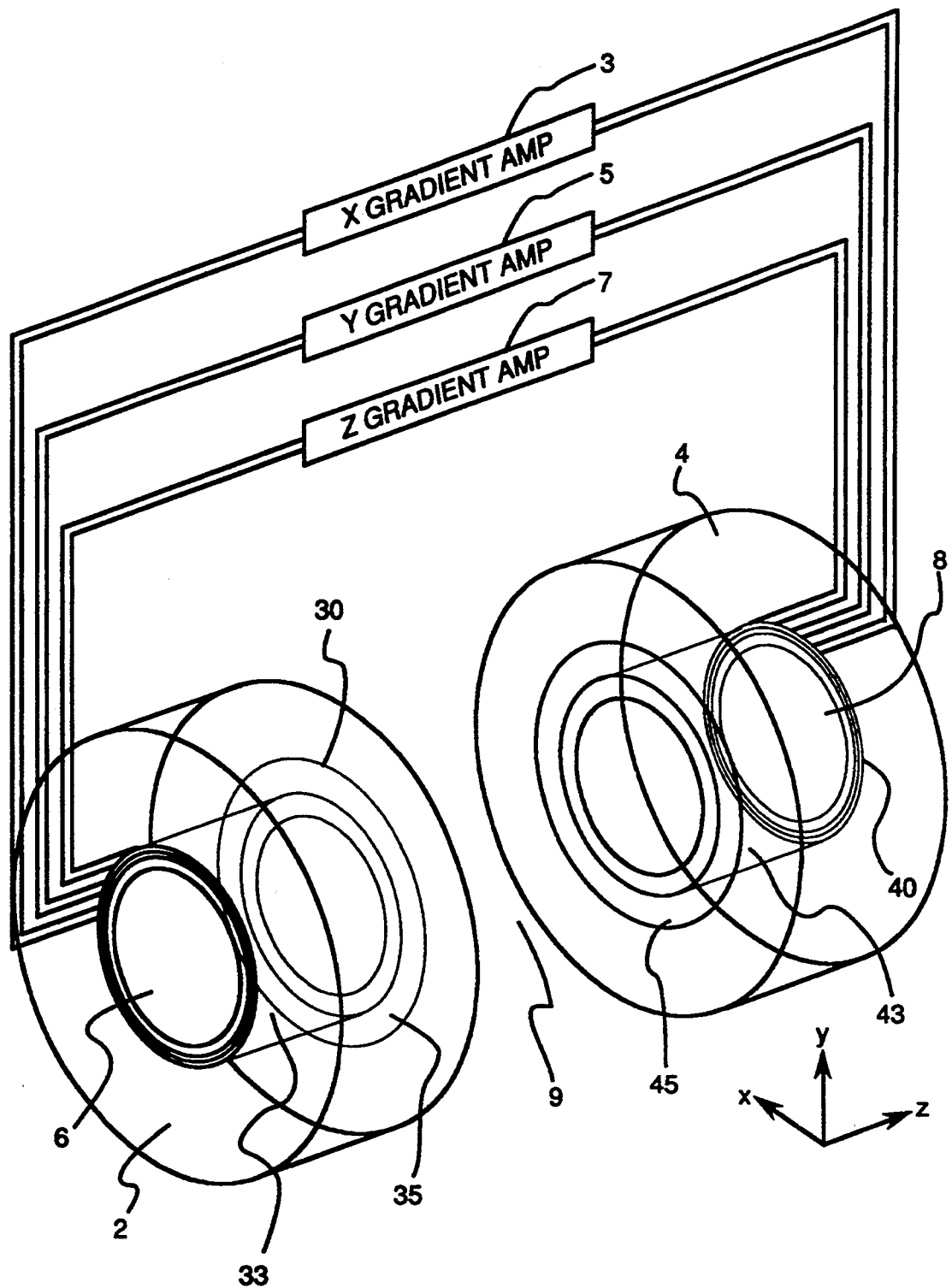
FIG. 3 is a perspective, partial schematic view of an open MR imaging magnet, gradient coils and radiofrequency (RF) coils, of the MR imaging system of FIG. 2.

In FIG. 3, the open main magnet of FIG. 2 is shown in enlarged view having two tings 2, 4, each containing one or more circular superconducting coils. Access to the patient is allowed between the tings in an open region 9 where a substantially uniform magnetic field is produced midway between the tings. The magnetic field gradient, in the X or Y directions, or for that matter, any direction perpendicular to the axis of the tings (the Z direction), is produced by two coils on one gradient coil carrier 30 and two coils on a second gradient coil carrier 40. Gradient coil carders 30, 40 each are comprised of a cylinder 33, 43 connected to a flange 35, 45 with two coils, each partially disposed on the cylinder and the flange. An opening 6, 8 in the center of each carder 30, 40 may receive the patient being imaged, or the patient may be positioned such the the region being imaged is placed within imaging volume 9.

In order to produce the required gradients over imaging volume 9 for MR imaging, several sets of gradient coils must be constructed. At least one set produces a magnetic field gradient in a "Z" direction along the length of the carrier cylinder. At least one other gradient coil set produces gradients in directions perpendicular to the carrier cylinder axis. These may be in the "X" and "Y" directions. Current is driven through the "X", "Y", and "Z" gradient coil sets by gradient coil amplifiers 3, 5, and 7, which together are represented as gradient amplifier 50 of FIG. 2.

In order to minimize the eddy currents produced in nearby conductors, an active shield coil is serially connected to each gradient coil set distributed onto the surface of a shield coil carder which lines the bore of the main magnet structure.

Figure 4:
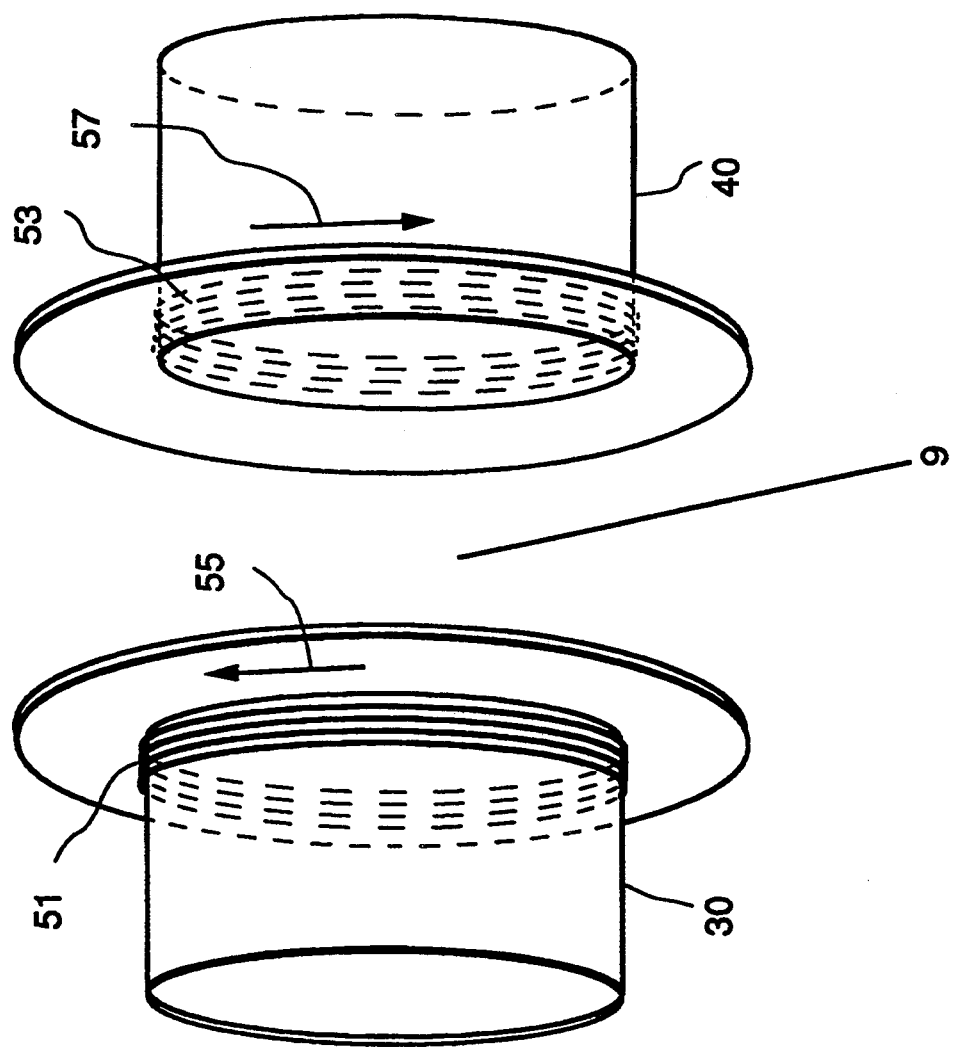
FIG. 4 is a perspective view of current paths disposed on gradient coil carriers to produce a gradient perpendicular to the "Z" axis according to the present invention.
Figure 4:
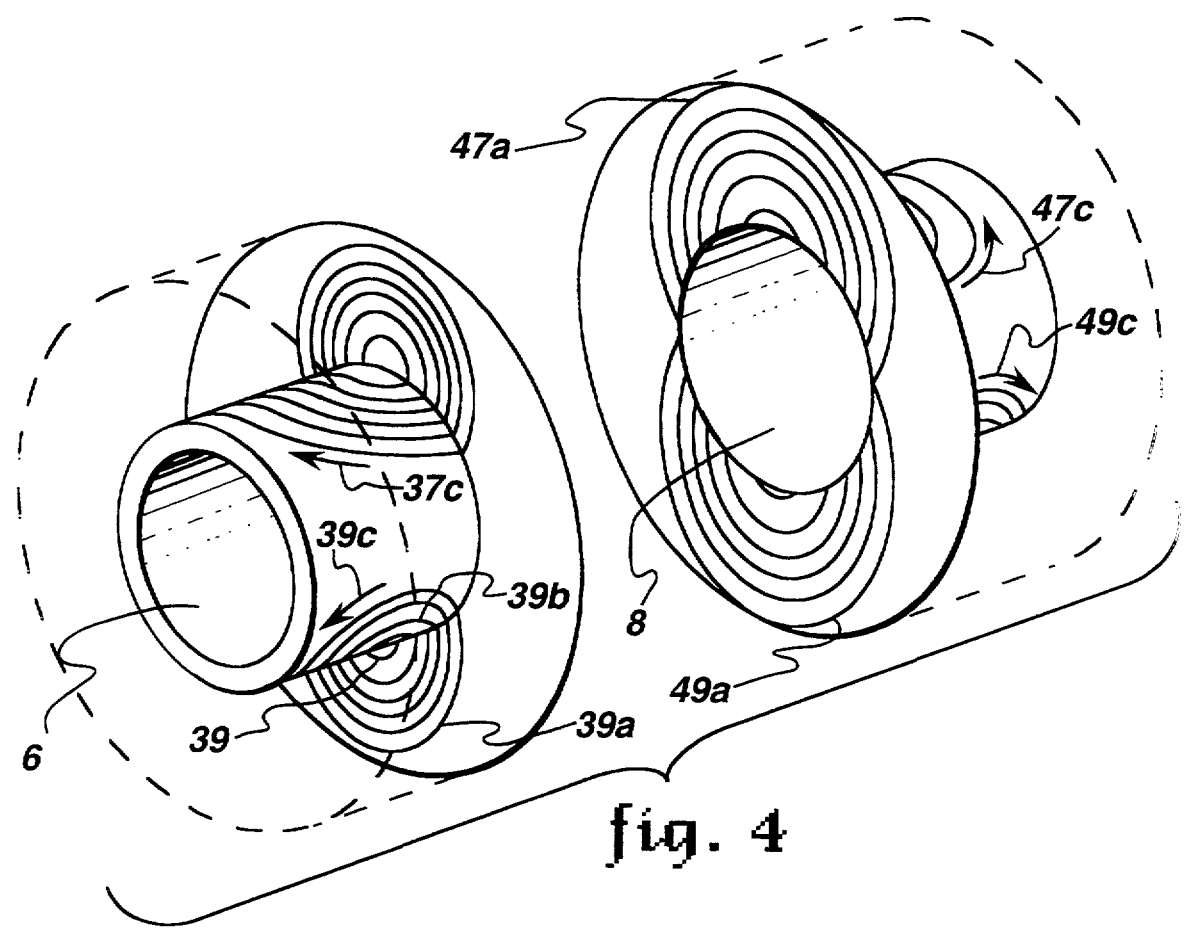

FIG. 4 is a perspective view of current paths to produce a gradient perpendicular to the "Z" axis disposed on gradient coil carders 30, 40. A coil 37 is disposed on one side of carrier 30 with a second coil 39 disposed on the other side such that a line passing through the center of the coils would pass through opening 6. Coils 37, 39 are comprised of a plurality of turns, each turn partially disposed on the cylinder, denoted by 37a, 39a, and partially disposed on the flange, 37b, 39b. Similarly, two coils 47, 49 are disposed opposite each other on carder 40. Each coil having a portion 47a, 49a disposed on the flange and a portion 47b, 49b disposed on the cylinder. The current flow to produce a magnetic field gradient in a direction perpendicular to the "Z" direction is shown by arrows 37c, 39c, 47c, 49c, for coils 37, 39, 47, 49, respectively.

If coils 37, 39, 47, 49 are positioned such that the "X" axis passes through their centers, they will produce a magnetic field gradient in the "X" direction. In order to produce a gradient in the "I" direction, another set of coils, the same as the first set, should be disposed on the gradient coil carriers rotated at a 90 degree angle relative to the first set of gradient coils.

While several presently preferred embodiments of the novel open imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. An open magnetic resonance (MR) imaging system allowing access to a patient being imaged comprising:
  a) an open main magnet having an imaging volume accessible by a physician outside of the main magnet, for producing a static magnetic field over a desired region of said patient to be imaged positioned in the imaging volume;
  c) open gradient coils which provide access to the imaging volume, for producing a magnetic field gradient over the desired region of said patient in the imaging volume when energized;
  d) a gradient amplifier coupled to the open gradient coils for energizing the gradient coils;

e) RF coils which provide access to the imaging volume, for transmitting RF radiation into said patient causing nutation of nuclear spins within the desired region of said patient when energized;

f) radiofrequency (RF) transmitter coupled to the RF coils for energizing the RF coils;

g) a pointing device adapted to interact with the physician to specify an orientation and position of an imaging plane within the desired region in which an image is to be acquired;

h) a pulse sequencer coupled to the gradient amplifier and the RF transmitter for activating the gradient amplifier and RF transmitter to a prescribed sequence thereby causing MR response signals to be emitted from nuclear spins in an imaging plane;

i) a general purpose computer coupled to the pointing device, and the pulse sequencer, directing the pulse sequencer to activate the gradient amplifier and RF transmitter with timing offsets to cause the imaging plane to have a position and orientation defined by the pointing device;

j) receiver for receiving a plurality of MR response signals from the nuclear spins within the desired imaging plane defined within said patient;

k) reconstruction unit coupled to the receiver for computing an image signal from the received MR response signals; and l) display means coupled to the reconstruction unit, for displaying an image from the image signal.

2. The open magnetic resonance (MR) imaging system of claim 1 further comprising a footswitch coupled to the general purpose computer for interacting with the physician to select between several predefined sets of imaging parameters.

3. The open magnetic resonance (MR) imaging system of claim 1 further comprising a controller coupled to the pointing device and the general purpose computer, the controller converting the signal from the pointing device into a format useable by the general purpose computer.

4. The open magnetic resonance (MR) imaging system of claim 1 wherein the display means comprises an operator's console.

5. The open magnetic resonance (MR) imaging system of claim 1 wherein the display means comprises:

a) a scan converter for reformatting the image signal into a monitor format signal; and b) a display screen for displaying an image from the monitor format signal.

6. The open magnetic resonance (MR) imaging system of claim 5 wherein the display means is a liquid crystal display unit having an RF shield shielding the liquid crystal display from RF interference, and inhibiting RF interference from being transmitted from the liquid crystal display.

* * * * *

UNITED STATES PATENT AND TRADEMARK OFFICE
CERTIFICATE OF CORRECTION

PATENT NO. : 5,365,927

DATED : November 22, 1994

INVENTOR(S) : Roemer et al.

It is certified that error appears in the above-identified patent and that said Letters Patent is hereby corrected as shown below:

IN THE DRAWINGS
Please delete Figure 4, and substitute the correct Figure 4, attached.

col. 1, line 21, delete "fiel" and substitute --filed--;
col. 6, line 27, delete "carder" and substitute --carriers--;
col. 6, line 34, delete "carders" and substitute --carriers--;
col. 6, line 44, delete "I" and substitute --Y--.

Signed and Sealed this

Twenty-fourth Day of September, 1996

*Attest:*

BRUCE LEHMAN

*Attesting Officer*     *Commissioner of Patents and Trademarks*